United States Patent [19]

Tsou

[11] Patent Number: 4,988,643
[45] Date of Patent: Jan. 29, 1991

[54] SELF-ALIGNING METAL INTERCONNECT FABRICATION

[75] Inventor: Morris H. Tsou, San Jose, Calif.
[73] Assignee: VLSI Technology, Inc., San Jose, Calif.
[21] Appl. No.: 419,284
[22] Filed: Oct. 10, 1989
[51] Int. Cl.$^5$ ...................... H01L 21/90; H01L 21/70
[52] U.S. Cl. ........................................ 437/200; 437/43; 437/43; 437/44; 437/57; 437/985
[58] Field of Search .................. 437/42, 43, 44, 200, 437/985, 57

[56] References Cited

U.S. PATENT DOCUMENTS

| | | | |
|---|---|---|---|
| 4,192,059 | 3/1980 | Khan et al. | 437/978 |
| 4,528,744 | 4/1985 | Shibata | 437/200 |
| 4,587,711 | 5/1986 | Godejahn, Jr. | 437/42 |
| 4,701,423 | 10/1987 | Szluk | 437/44 |
| 4,877,755 | 10/1989 | Rodder | 437/200 |

*Primary Examiner*—Brian E. Hearn
*Assistant Examiner*—Laura M. Holtzman
*Attorney, Agent, or Firm*—Clifton L. Anderson

[57] ABSTRACT

In a method for fabricating a MOS device, a nitride cap is formed over a remote interconnect of gate material. In a subsequent oxide growth step, oxide is formed over another remote interconnect and transistor gates, while the nitride cap prevents oxide growth over the first remote interconnect. Thinner oxide over source and drain regions is removed, leaving oxide formations over the gates and the second interconnect; the nitride cap is also removed. Silicide is then formed over the source and drain regions and over portions of the first remote interconnect. A conducting layer is deposited and a local interconnect is then patterned therefrom which electrically connects the first remote interconnect to at least one source/drain region without using via holes. This local interconnect crosses over the second remote interconnect, while being insulated from it by the oxide formation. The result of the method is an integrated circuit device with this bridging interconnect and compact dimensions, the latter due to the relaxed tolerances afford by the self-aligning features of the method.

4 Claims, 2 Drawing Sheets

SELF-ALIGNING METAL INTERCONNECT FABRICATION

BACKGROUND OF THE INVENTION

The present invention relates to semiconductor processing and, more particularly, to a method of forming semiconductor devices and interconnects therebetween. A major objective of the present invention is to provide for interconnects without vias and with minimum spacing and overlap design rules.

The semiconductor industry has spurred technology by providing integrated circuits with greater functionality per unit area. In large part, miniaturization of integrated circuits is attributed to refinements in the lithographic systems which have permitted ever smaller feature sizes for the devices defined on an integrated circuit. For a given feature size, mask alignment tolerances and routing constraints limit the functional density of an integrated circuit.

The circuit density limits imposed by mask alignment tolerances can be described in connection with a conventional metal-oxide-silicon (MOS) transistor. A MOS transistor includes a source, a drain and a gate which can be used to control a current between the source and drain. Connecting such a transistor to other circuit devices on an integrated circuit requires that conductors be electrically connected to its source, drain and gate. Typically, the gate includes a metal or doped polysilicon (polycrystalline silicon) pedestal. The source and drain are formed in a silicon substrate to either side of this pedestal.

Conventionally, an insulating oxide is deposited over the source, drain and gate pedestal. Vias are formed through the oxide layer, for example, over the source and drain. A metal layer is deposited and patterned over the oxide. The metal layer accesses the source and drain through the vias to define conductive leads for the source and drain.

Care must be taken to ensure that the vias are properly aligned with the source and drain. Otherwise, they can cause a short with the gate or with the substrate to either side of the source and drain. This care is taken in the form of source and drain areas which are larger than otherwise necessary for device functioning. In other words, functional density is compromised by the tolerances required to ensure proper via alignment. Similar tolerances are required when connecting the metal interconnect material to other polysilicon conductors. Typically, the polysilicon conductors are enlarged where connections are to be made to prevent vias between the metal and polysilicon from shorting to the substrate.

Some tolerance requirements in the conventional interconnect approach are avoided by methods using a silicidable metal to define self-aligned source and drain contacts. A "silicidable metal" is a metal that can be sintered with an adjacent silicon material to form a metal silicide. A silicidable metal is deposited over the transistor without an intermediate insulating layer. Sintering causes the formation of silicide over the source and drain regions, as well as over the gate pedestal. A wet etch is used to remove the metal over regions where silicide has not formed.

Since the silicide is exposed at the source and drain, vias are not required over the source and drain to provide for electrical interconnection with subsequently formed interconnect metal. A more compact transistor is made possible since the transistor need not be oversized to accommodate the tolerances required for via formation over the source and drain. However, the source and drain are separated from the gate pedestal only by a thin oxide spacer, so some enlargement relative to the compact ideal for a given feature size is required to prevent source and drain interconnects from shorting to the gate.

The self-aligning approach can be extended to provide local interconnects by selectively reacting portions of the metal layer. The reacting can be done with nitrogen as disclosed by Thomas Tang, Che-Chia Wei, Roger Haken, Thomas Holloway, Chang-Feng Wan and Monte Douglas in "VLSI Local Interconnect Level Using Titanium Nitride", IEDM, 1985. Alternatively, silicide can be formed over the metal layer as disclosed by Devereaux C. Chen, Simon S. Wong, Paul Vande Voorde, P. Merchant, Tom R. Cass, Jun Amano, and Kuang-Yi Chiu in "A New Device Interconnect Scheme for Sub-Micron VLSI", IEDM, 1984. In either case, the reacting material is patterned over the metal using a mask. Therefore, strict masking tolerances are still required to ensure that interconnect metal does not short to the gate silicide.

A more serious disadvantage of the self-aligning approaches is that bridging interconnects are not provided conveniently. A bridging interconnect is one which crosses another interconnect without making an electrical connection thereto. Bridging interconnects are easily defined in conventional MOS processing in which the intermediate dielectric layer provides the required electrical insulation except where vias are formed. The self-aligning approaches do not form an dielectric layer through which vias are to be formed. While this provides for more compact devices, it makes insulated conductor crossings more difficult to obtain. In fact, the art cited above does not suggest how bridging interconnects can be made.

It is, therefore, a major objective of the present invention to provide a semiconductor process which provides for bridging interconnects without requiring vias to sources and drains. It is a further object of the invention to provide such a process which minimizes the need for mask alignment tolerances so that an integrated circuit structure with more compact transistor structures and interconnect routings can be provided.

SUMMARY OF THE INVENTION

In accordance with the present invention, an oxide layer is grown over a gate pedestal, or similar structure, and an "underlying" interconnect to isolate them from an "overlaying" interconnect. Prior to this oxide growth step, an oxide retarding layer, e.g., silicon nitride, is defined over another underlying interconnect which is to be electrically connected to the overlaying interconnect. After the oxide growth step, the retarding layer can be removed. Silicide formations can be defined over source and drain regions and over the exposed underlying interconnect. The overlaying interconnect can be defined to extend from a source or drain region to the silicided underlying interconnect. The overlaying interconnect can cross over the oxide coated underlying interconnect so as to remain electrically insulated therefrom. Thus, a bridging interconnect is provided. Furthermore, oxide left over the gate pedestal insulates it from the overlaying interconnect relaxing masking tolerances for the overlaying interconnects.

The advantages of the inventive method are best understood in the context of a typical structure comprising a MOS transistor, a first remote interconnect, and a second remote interconnect lying between the transistor and the first remote interconnect. The remote interconnecs are preferably formed at the same time and of the same material as the gate pedestal. Herein, a remote interconnect is an interconnect that provides for electrical connections between transistors, but requires a local interconnect to a transistor of interest. The transistor includes a gate, a source and a drain. Since, source and drain are treated similarly in the context of this application, they are referred to collectively as current-carrying regions herein.

The present invention provides for the formation of a local overlaying interconnect between a first current-carrying region and an underlying first remote interconnect. The local interconnect is electrically connected to the first-current-carrying region through an intermediate silicide formation and is electrically connected to the first remote interconnect through another intermediate silicide formation. The local interconnect is electrically insulated from a second underlying remote interconnect by an oxide formation. Furthermore, an oxide formation over the gate prevents shorting of the local interconnect thereto.

In contrast to silicide self-alignment techniques described in the background section above, the present invention provides that gates and some interconnects are covered with oxide during silicide formation. In the background art, oxide sidewalls provided insulation to the sides of the gates, but the anisotropic etch used to defined the sidewalls removed all oxide from the top of the gate and remote interconnect structures. Thus, silicide was formed over the exposed gate and interconnect structures. The silicide over the interconnects made it difficult to define bridging interconnects. The silicide over the gate required design tolerances to avoiding shorting by local interconnects.

In the structure provided by the present invention, the gates are covered with oxide, rather than silicide, so tolerances required to prevent shorting of a local interconnect to a gate can be relaxed considerably. Similarly, bridging (overlaying) interconnects can be made to silicide-coated remote interconnects over oxide-coated remote interconnects. While an additional masking step is required to define the nitride formation which prevents oxide formation over some remote interconnects, this masking step is subject to relaxed tolerances. The nitride over a first remote interconnect should not extend to current-carrying regions and remote interconnects, unless electrical connection is intended. However, this allows nitride mask alignment tolerances on the order of a feature size. It is not necessary for the nitride mask to cover the remote interconnect completely, since, in general, a partial physical contact between the silicide and local interconnect to be formed will suffice for an electrical connection.

Thus, the present invention provides for bridging interconnects in the context of a self-aligning silicide process and the advantages in device density and masking tolerances provided by such processes over non-self-aligning processes. Furthermore, the present silicide self-aligning process provides further relaxation of masking tolerances to provide for smaller transistors and other integrated circuit devices. These and other features and advantages of the present invention are apparent from the description below with reference to the following drawings.

BRIEF DESCRIPTION OF THE DRAWINGS

FIG. 1A is shown with cutaways to disclose polysilicon below oxide insulation and source and drain regions below silicide.

DESCRIPTION OF THE PREFERRED EMBODIMENTS

Figure 1A:
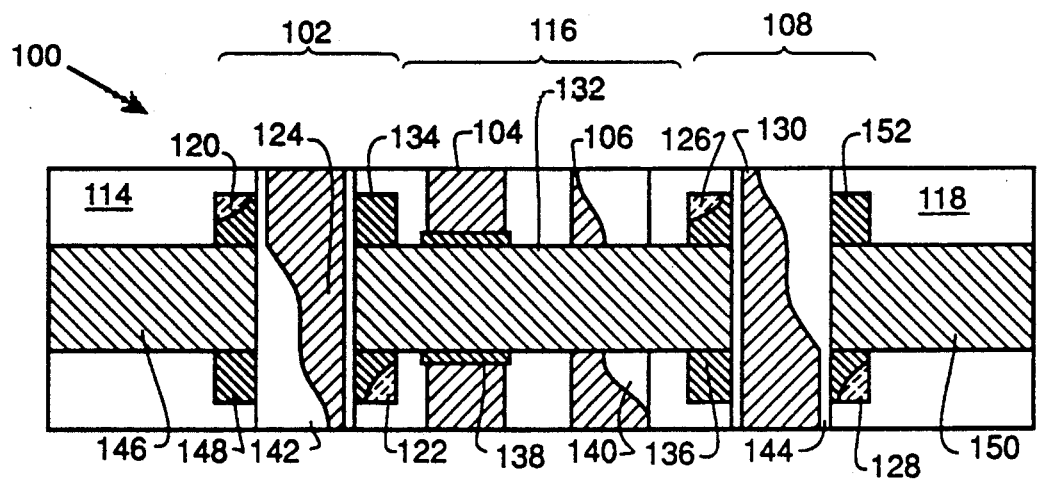
FIG. 1A is a plan view and FIG. 1B is a sectional view of a semiconductor structure in accordance with the present invention.
Figure 1B:
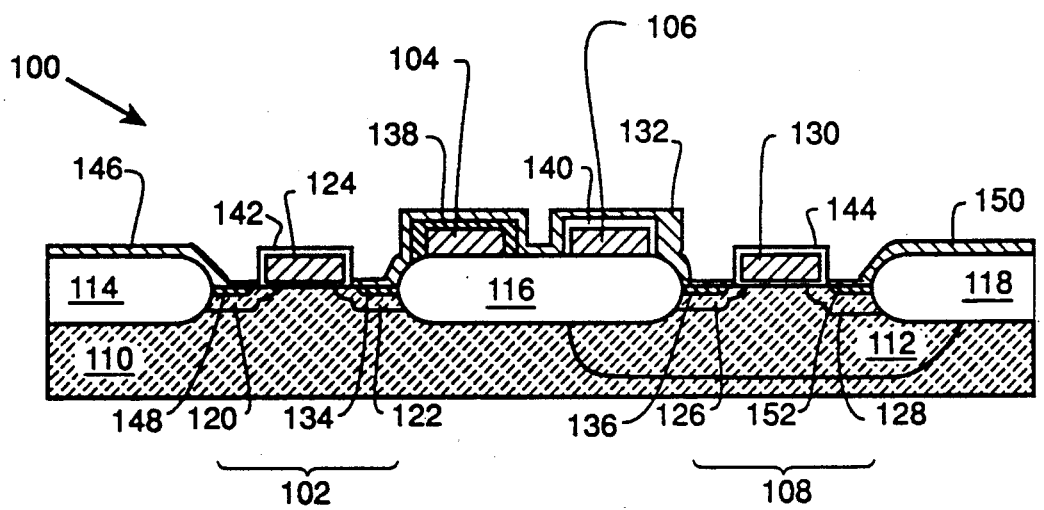

In accordance with the present invention, a CMOS inverter 100 comprises an NMOS transistor 102, a first remote interconnect 104, a second remote interconnect 106, and a PMOS transistor 108, as shown in FIGS. 1A and 1B. These structures are fabricated on a substrate 110 of p-type silicon which includes an n-type region, n-well 112 at which PMOS transistor 108 is fabricated, as shown in FIG. 1B. Transistors 102 and 108 are isolated from each other and neighboring transistors (not shown) by "left", "center" and "right" field oxides 114, 116, and 118, respectively. NMOS transistor 102 comprises a source 120 and a drain 122, between which current can be carried at a rate regulated by the voltage at the gate 124 of transistor 102. Similarly, PMOS transistor 108 comprises a drain 126, a source 128, and a gate 130.

CMOS inverter 100 is implemented using a local interconnect 132 between NMOS drain 122 and PMOS drain 126. Local interconnect 132 makes electrical contact with NMOS drain 122 through a silicide formation 134 and with PMOS drain 126 through a silicide formation 136. In addition, local interconnect 132 makes electrical contact with remote interconnect 104 via a silicide formation 138. Local interconnect 132 extends over remote interconnect 106 and is electrically insulated therefrom by an oxide formation 140. Thus, a bridging local interconnect is achieved.

Oxide formations 142 and 144 over gates 124 and 130 prevent shorting thereto by local interconnect 132 despite any moderate masking misalignment relative to gates 124 and 130. As indicated below, the oxide over the gates thus minimizes masking tolerances during the formation of local interconnect 132. Devices fabricated in accordance with the described prior art self-aligning silicide processes would have silicide rather than oxide on top of their gates and would not provide a bridging interconnect. Furthermore, a tolerance is required to prevent interconnect material from shorting to the gate preventing the transistor from being as compact as desired.

Electrical access to NMOS source 120 is provided by a local interconnect 146 which contacts a silicide formation 148 over source 120 and extends over field oxide 114. Likewise, a local interconnect 150 contacts a silicide formation 152 over PMOS source 128 and extends over field oxide 118.

Figure 2A:
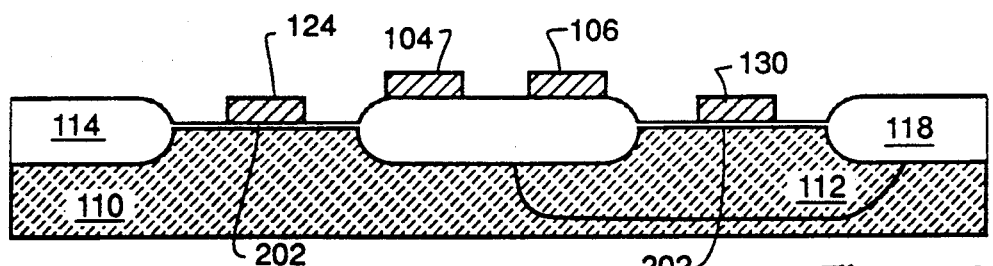
FIGS. 2A–2E are sectional views of the semiconductor structure of FIGS. 1A and 1B at successive stages in its fabrication in accordance with the method of the present invention.

In accordance with the method of the present invention, CMOS inverter 100 can be fabricated in a conventional manner until the structure of FIG. 2A is achieved. N-well 112 is defined by introducing dopant in the region of p-type substrate 110 at which PMOS transistor 108 is to be defined so that the conductivity type of the region is reversed. Field oxides 114, 116, and 118 are formed conventionally. A relatively short oxide growth cycle is then used to define gate oxides 202 between the field oxides. Polysilicon is then deposited and heavily doped over the field and gate oxides to increase its conductivity. The polysilicon is then lithographically patterned to define gates 124 and 130 and remote interconnects 104 and 106. Those skilled in the art will recognize alternative procedures to achieve the structure of FIG. 2A and similar structures.

The present invention departs from conventional processing by depositing a nitride layer over the structure of FIG. 2A. A nitride cap 204 is photolithographically defined from this layer, resulting in the structure of FIG. 2B. The purpose of nitride cap 204 is to prevent or limit oxide growth over remote interconnect 104 so that an electrical connection can be made thereto by local interconnect 132, as indicated by comparison of FIGS. 1B and 2B.

The addition of nitride cap 204 involves a masking step not required in the prior art, and thus introduces an extra tolerance which must be considered. This tolerance is very relaxed. The nitride can extend to the left over the left edge of field oxide 116 and even over gate oxide 202 over region 206 where drain 122 is to be defined. The left limit is gate 124, which must not be contacted by the nitride or else interconnect 104 and drain 122 could short to it once local interconnect 132 is formed. Nitride cap 204 can extend to the right of remote interconnect 104 short of contacting remote interconnect 106. It is not necessary that remote interconnect 104 be entirely covered. It is sufficient that nitride cap 204 cover an area large enough for forming an electrical contact. Thus, the tolerances involved in forming nitride cap 204 are on the order of the feature size for inverter 100.

Figure 2B:
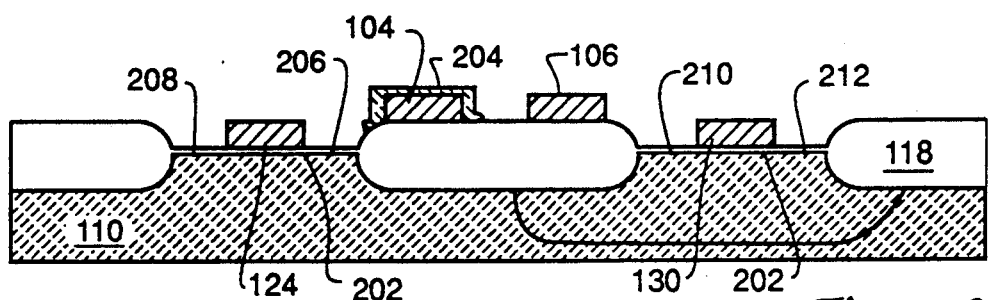
Figure 2C:
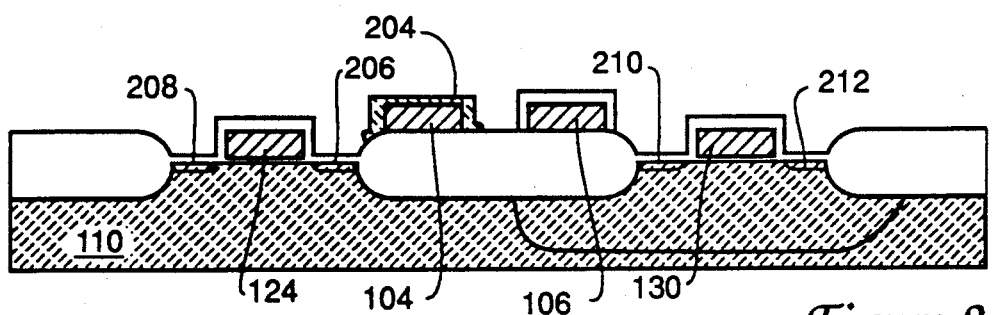

Oxide is grown over the structure of FIG. 2B. The oxide grows relatively rapidly over the gates 124 and 130 and remote interconnect 106, and relatively slowly over the diffused source and drain regions 206, 208, 210 and 212, FIG. 2B. Where lightly doped drain structures are desired, source and drain regions 206, 208, 210 and 212 can be lightly doped prior to this oxidation.

The relatively rapid growth over the polysilicon is attributable to its relative rough surface. Polysilicon is polycrystalline so that its surface is inherently less smooth than the surface of the single crystal substrate at source and drain regions 206, 208, 210 and 212. Moreover, the previous heavy doping of the polysilicon further enhances the growth rate. Crystalline substrate 110 is not heavily doped at this point so the growth rate thereover is very slow compared to that over the heavily doped polysilicon. This differential oxide growth is enhanced by low temperature oxidation, e.g., at about 800° C. At most negligible oxide growth occurs over remote interconnect 104 where it is protected by nitride cap 204.

Figure 2D:
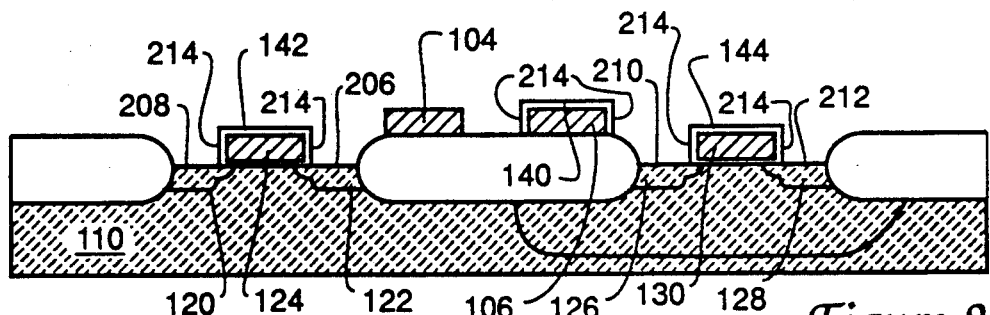

The oxide is then etched until it is removed over source and drain regions 206, 208, 210 and 212. The originally thick oxide over gates 124 and 130 is only partially removed during this etch establishing oxide formations 140, 142, and 144 over remote interconnect 106 and gates 124 and 130, as shown in FIG. 2D. The etch is anisotropic so that sidewalls 214 on these structures retain most of their lateral thickness. Nitride cap 204 is removed using a wet etch. An n-type dopant is implanted in regions 206 and 208 to define NMOS source 120 and NMOS drain 122, and a p-type dopant is implanted in the regions 210 and 212 to define PMOS drain 126 and PMOS source 128. The resulting structure is shown in FIG. 2D.

Titanium is deposited over the structure of FIG. 2D and sintered to form silicide wherever silicon is exposed, but not where silicon dioxide is exposed. Other silicidable metals, preferably refractory metals, can be used as alternatives to titanium. The metal which has not converted to silicide is then etched away, yielding the structure of FIG. 2E. Thus, silicide formation 148 at source 120, silicide formation 134 at drain 122, silicide formation 138 over remote interconnect 104, silicide formation 136 at drain 126, and silicide formation 152 at source 128 are created. These silicide formations serve as electrical contacts for the elements underlying them.

Figure 2E:
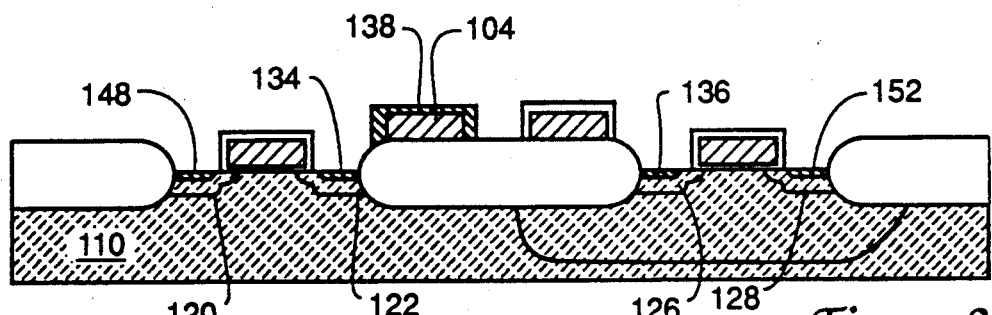

Polysilicon or other conductive material can be deposited over the structure of FIG. 2E. The polysilicon is then patterned to define local interconnects 132, 146 and 150, shown in FIG. 1B. Local interconnect 146 provides electrical access to source 120 via silicide formation 148. The masking tolerance for local interconnect 146 is quite generous. It must overlap silicide formation 148 sufficiently for electrical connection to be assured. It can extend beyond silicide formation 148 and onto oxide-coated gate 124 without shorting. An alignment error on the order of the width of silicide formation 148 or gate 124 would be required for a short or contact failure for local interconnect 146. Local interconnect 150 is subject to similarly relaxed alignment tolerances is providing access to source 128 via silicide formation 152.

Local interconnect 132 straps drains 122 and 126 to enable the inverter function for CMOS inverter 100. Local interconnect 132 is also subject to quite relaxed alignment tolerances. Oxide formations 140, 142 and 144 prevent shorts to remote interconnect 106 and gates 124 and 130. An alignment error on the order of the gate width or the width of drains 122 and 126 would be required for a contact failure or a short to result. Electrical access to gates 124 and 130 and remote interconnect 106 can be made using conventional vias through their respective oxide formations 142, 144 and 132 and later deposited oxide. These vias can be formed over pads located away from the active components of transistors 102 and 108, thus minimally impacting device speed and compactness.

The underlying interconnect is preferably co-formed with the gate, but can be formed in a separate procedure. Polysilicon and polycide (silicide on top of polysilicon) are suitable materials for both the gate and underlying interconnects. While the present invention has been illustrated in the context of a CMOS inverter, those skilled in the art can recognize its applicability to a broad range of alternative devices. P-well CMOS and twin-well CMOS are provided for. Doubly-doped drain and lightly doped drain structures are provided along with conventional drain structures.

While nitride is disclosed as the oxide-retarding material, other materials can be used to define oxide-retarding covers for a non-contacting remote interconnect. While silicide is the disclose sintering product, other sintering products can result where a non-silicon substrate is used.

The advantages of relaxed masking tolerances and bridging interconnects have wide applicability. The method of the present invention applies not only to CMOS processing, but also to NMOS, PMOS and non-MOS semiconductor processing techniques. Materials other than a nitride can be used to protect a remote interconnect or alternative structure from oxide growth. The material can prevent or inhibit oxide growth. Different conductor materials can be used for the local interconnects. Different silicidable metals can be used for the silicide formations. Dopants can be introduced at different times, either while oxide is in place over the source and drain regions, or while these regions are exposed, or both, where dopant is introduced in stages. These and other variations upon and modifications to the disclosed embodiments are provided for by the present invention, the scope of which is limited only by the following claims.

What is claimed is:

1. A method of forming a bridging interconnect between a current-carrying region of a transistor and a connection conductor so that said interconnect crosses without electrically contacting an intermediate noncontacting conductor, said current-carrying region being formed in a semiconductor substrate, said connection conductor and said noncontacting conductor being formed on said substrate, said method comprising the steps of:
  (a) at least partially covering said connection conductor with an oxide-retarding material which inhibits the growth of an oxide on said conductor;
  (b) growing an oxide on the structure defined by step (a) so as to form
    a relatively thick oxide cover over said noncontracting conductor, and
    a relatively thin oxide over said current-carrying region;
  (c) etching the oxide grown in step (b) sufficiently to remove oxide from over said current-carrying region while limiting etching so that said relatively thick oxide cover over said noncontacting conductor is not completely removed;
  (d) at least partially removing said oxide-retarding material from over said connection conductor;
  (e) depositing a sinterable metal over the structure defined by step (d);
  (f) sintering the sinterable metal deposited in step (e) so that it sinters with said current-carrying region and said connection conductor, said metal not sintering where it contacts oxide;
  (g) removing unsintered metal; and
  (h) defining a conductor extending from sintered metal over said current-carrying region to over said connection conductor;
  whereby, said sintered metal electrically connects said current-carrying region and said connection conductor, while remaining insulated from said noncontacting conductor by oxide grown in step (b) and not removed in step (c).

2. A method of forming an electrical interconnect between a first element consisting of a first material and a second element consisting of a second material while protecting a third element consisting of said second material from shorting to said electrical interconnect, said first element, said second element and said third element being formed on a substrate, said method comprising:
  (a) selecting said second material to be one on which an oxide layer can be thermally grown substantially faster than an oxide layer can be thermally grown on said first material under the same conditions;
  (b) covering said second element with a cover material upon which oxide growth under said conditions is at most as fast as on said first material, said cover material being patterned lithographically so as not to cover said third element;
  (c) thermally growing an oxide layer on the structure defined by step (b);
  (d) etching away sufficient oxide grown in step (c) so as to at least partially expose said first element while leaving oxide over said third element and etching said cover material so that said second element is at least partially exposed;
  (e) depositing a sinterable metal over the structure defined by step (d) and sintering said sinterable metal so that it binds with said first element and said second element, but not with the oxide covering said third element;
  (f) etching said sinterable metal deposited in step (e) so as to remove it from over said third element; and
  (g) forming a conductive interconnect between said first element and said second element, said interconnect being defined lithographically;
  whereby, said first element is electrically connected to said second element and said third element is electrically insulated from said interconnect by the oxide grown in step (c) and left after step (d).

3. A method of forming a electrically conductive bridge between a region of a crystalline semiconductor surface and a connecting conductor formed over said surface so that said bridge is electrically insulated from an intermediate non-connecting conductor, said method comprising:
  (a) photolithographically form a silicon nitride cover which at least partially covers said connecting conductor, at most partially covers said region, and negligibly covers said non-connecting conductor;
  (b) thermally growing silicon dioxide over the structure resulting from step (a) whereby a relatively thick layer of silicon dioxide is formed over said non-connecting conductor, a relatively thin layer of silicon dioxide is formed over said region, and at most negligible silicon dioxide is formed over said nitride cover;
  (c) etching off said silicon nitride cover and implanting dopant into said region;
  (d) etching said silicon dioxide sufficiently to expose said region while leaving a thickness of silicon dioxide over said non-connecting conductor;
  (e) depositing a silicidable metal over the structure resulting from step (d);
  (f) sintering said silicidable metal so that a silicide is formed over said region and said connecting conductor; and
  (g) photolithographically forming a conductive bridge extending between said region and said connecting conductor;
  whereby, said region is electrically connected to said connecting conductor and electrically insulated from said non-conducting layer by the silicon dioxide remaining after step (d).

4. A method of forming a metal-on-silicon transistor with a bridge between a source/drain region and a source/drain conductor so that said bridge extends over but is electrically insulated from a non-connecting conductor, said method comprising:
  (a) forming a structure including a crystalline silicon substrate, a device region within said substrate, a thin layer of oxide over said source/drain region, and a gate pedestal over said device region, said gate pedestal defining an underlying gate region which divides said device region into a source region and a drain region;

(b) photolithographically defining a nitride cover which at least partially covers said source/drain conductor, at most partially covers said source/drain region, and at most negligibly covers said non-connecting cover and said gate pedestal;

(c) thermally growing silicon dioxide over the structure resulting from step (b), whereby a relatively thick layer of silicon dioxide is formed over said gate pedestal and said source/drain conductor, a relatively thin layer of silicon dioxide is formed over said source/drain region, and negligible silicon dioxide is formed over said nitride cover;

(d) etching off said nitride cover and implanting dopant into said source/drain region;

(e) etching said silicon dioxide sufficiently to expose said source/drain region while leaving a silicon dioxide layer over said gate pedestal and said source/drain conductor;

(f) depositing a silicidable metal over the structure resulting after step (e);

(g) sintering said silicidable metal so as to form a silicide over said source/drain region; and (h) photolithographically patterning said silicidable metal so as to define a conductive bridge between said source/drain region and said source/drain conductor;

whereby, said bridge electrically connects said source/drain region and said source/drain conductor, while said gate pedestal and said non-connecting conductor remain insulated by said bridge by silicon dioxide left after step (e).

* * * * *